United States Patent [19]

Kuyel

[11] Patent Number: 4,742,233
[45] Date of Patent: May 3, 1988

[54] METHOD AND APPARATUS FOR AUTOMATED READING OF VERNIER PATTERNS

[75] Inventor: Birol Kuyel, Pennington, N.J.

[73] Assignee: American Telephone and Telgraph Company, New York, N.Y.

[21] Appl. No.: 945,049

[22] Filed: Dec. 22, 1986

[51] Int. Cl.⁴ ............................................. G01N 23/04
[52] U.S. Cl. ............................... 250/491.1; 250/492.2; 356/400; 356/401; 368/490
[58] Field of Search ......................... 250/491.1, 492.2; 356/400, 401; 33/1 N; 464/490, 491

[56] References Cited

U.S. PATENT DOCUMENTS

| | | | |
|---|---|---|---|
| 4,200,395 | 5/1980 | Smith et al. | 250/550 |
| 4,292,672 | 9/1981 | Southgate | 364/507 |
| 4,349,880 | 9/1982 | Southgate | 364/507 |
| 4,449,193 | 5/1984 | Tournois | 364/604 |

Primary Examiner—Carolyn E. Fields
Assistant Examiner—John A. Miller
Attorney, Agent, or Firm—Robert B. Levy

[57] ABSTRACT

Automatic determination of the lateral offset between a pair of overlapping vernier patterns (20 and 22) on overlying layers (14 and 15) of a semiconductor wafer (10) is achieved by first capturing the image of the vernier patterns using a television camera (26). The output signal of the television camera is processed by an image acquisition circuit (32) coupled to a computer (34) to determine the intensity of each of a plurality of pixels lying within a strip extending across the image of the vernier patterns. The intensity of each of the pixels is mathematically correlated by the computer (34) with each of a plurality of values corresponding to the intensity of each of a plurality of pixels comprising an image representative of a pair of aligned vernier patterns. The location within the captured image of the maximum of the correlated intensities is then found. The offset between the pair of vernier patterns is determined in accordance with the distance between the location of the maximum of the correlated intensities and the center of one of the pair of vernier patterns.

13 Claims, 5 Drawing Sheets

METHOD AND APPARATUS FOR AUTOMATED READING OF VERNIER PATTERNS

TECHNICAL FIELD

This invention relates to a method and apparatus for automatically determining the lateral offset between a pair of overlapping vernier patterns.

BACKGROUND ART

Integrated circuits are commonly fabricated by first forming an ingot of a single crystal semiconductor material, typically silicon, which is sliced into thin wafers. A thin epitaxial layer of semiconductor material, typically silicon, having a controlled amount of impurities, is then grown on the wafer. Thereafter, at least one passivation layer (typically $SiO_2$) is formed over the epitaxial layer. One or more windows (features) are created through the passivation layer by the process of photolithography. Creation of the windows by the process of photolithography is accomplished by first applying a coating of photoresist to the passivation layer. Thereafter, the coating of photoresist is selectively exposed to radiation through a photomask. The photoresist is developed, causing the nonexposed portions thereof to be washed away. The wafer is then etched, thereby creating windows within those areas on the surface of the passivation layer not covered by the photoresist.

Once the windows have been created in the passivation layer, then impurities may be introduced therethrough into the wafer. After introduction of the impurities, one or more additional layers are successively formed over the passivation layer. One or more windows may be created through each additional layer by the above-described process of photolithography prior to formation of the next layer thereover. Typically, such windows are created for the purpose of making electrical connections between layers. Depending on the type of integrated circuit to be fabricated, as many as nine different layers may be formed on the wafer, each layer having at least one window therethrough.

It is extremely important that the windows through each layer above the passivation layer be precisely located a predetermined lateral distance relative to each window through the latter. Even a very small registration error between the windows through the passivation layer and the windows in any of the wafer layers thereabove may render the integrated circuits produced from the wafer inoperative. Such registration errors are due primarily to a misalignment between the passivation layer and the photomask used to expose the resist pattern on the overlying wafer layer.

To detect for such misalignment, each of a first set of spaced vernier patterns is etched into the passivation layer simultaneously with the formation of the windows therethrough. Thereafter, a next layer is formed over the passivation layer. Resist is then applied to the overlying wafer layer. The resist is exposed and developed not only to create windows therein (to establish the design of the windows through the layer overlying the passivation layer) but also to create a vernier pattern overlapping one of the vernier patterns on the passivation layer. Typically, the passivation layer is light transmissive so the overlapping pair of vernier patterns can be seen by looking at the patterned resist on the overlying wafer layer.

Each of the first set of vernier patterns etched into the passivation layer, as well as the vernier pattern formed by patterning the resist on the overlying wafer layer, is comprised of a plurality of thin bars, usually 2-3 microns wide. The bars of each vernier pattern on the passivation layer are spaced a distance D apart whereas the bars of the vernier pattern formed by patterning the resist on the overlying wafer layer are spaced $D+\delta$ apart. Typical values for D and $\delta$ are 15 microns and 0.125 microns, respectively. The value of $\delta$ corresponds to the precision to which the offset error between a pair of overlapping vernier patterns can be resolved.

The point at which one of the vernier patterns on the passivation layer is said to be aligned with the overlapping vernier pattern on the wafer layer thereabove occurs where one of the bars of the former appears spaced between a pair of bars of the latter. The lateral offset between the pair of overlapping vernier patterns is given by the product of $\delta$ and n where n is the number of bars separating the best centered bar of the one vernier pattern on the passivation layer from a known reference point. Usually, the reference point is located at the center of the one vernier pattern. The lateral offset between the overlapping pair of vernier patterns is representative of the misalignment between the passivation layer and the photomask used to expose the resist on the wafer layer thereabove.

Presently, the lateral offset between the pair of overlapping vernier patterns is determined (read) manually. Usually, only one or two wafers in a given lot is actually inspected for this purpose. An operator typically places the wafer to be inspected on the stage of a microscope and identifies which of the bars of the vernier pattern on the passivation layer is best centered between a pair of bars of the vernier pattern on the overlying wafer layer. If the offset error between the pair of overlapping vernier patterns exceeds a desired production tolerance value, the resist on the layer overlying the passivation layer of each wafer in the lot is stripped therefrom. The misalignment between the passivation layer and the photomask previously employed to expose the resist on the overlying layer of each wafer is then corrected. Thereafter, resist is re-applied to each wafer and is again patterned so as to create the vernier pattern on the overlying layer thereof as well as the desired windows therethrough. The offset error between the pair of overlapping vernier patterns on one or two of the wafers in the lot is again read, and if the lateral offset is within production tolerances, the wafers are then etched.

After etching, another layer may be grown over the just-etched layer on each wafer. Resist is applied to this newly formed layer on each wafer and then is patterned to create a vernier pattern thereon as well as the desired windows therethrough to establish the location of the windows through this newly formed layer. The vernier pattern on this newly formed layer on each wafer is situated in registration with an opening through the layer therebeneath so as to overlap another of the first set of vernier patterns on the passivation layer. Again, at least one sample wafer is selected and the offset between the newly created vernier pattern and one of the vernier patterns on the passivation layer is then read. The wafers within the lot are either etched or their resist layer on each is stripped therefrom, depending on the magnitude of the offset error.

Before each newly formed layer on the wafer is etched to create windows therethrough, the offset between the vernier pattern thereon formed by the patterned resist and an underlying one of the vernier patterns on the passivation layer is read. Often, there may be as many as nine separate layers grown over the passivation layer, so there will be nine separate pairs of overlapping vernier patterns which must be read to determine the offset error therebetween. It is extremely desirable that the reading of the offset error between each pair of overlapping vernier patterns be as accurate as possible to avoid large overlay errors which can decrease manufacturing yields.

Unfortunately, manual reading of the offset between each pair of overlapping vernier patterns does not always afford a very high degree of accuracy. Many times the operator may experience difficulty in determining which of the bars of one of the pair of overlapping vernier patterns is best centered between a pair of bars of the other. Sometimes, several bars of one of the overlapping vernier patterns may appear to be best centered because of the small offset between the vernier patterns. Other factors which contribute to reading of the offset between a pair of overlapping vernier patterns are: (1) a lack of contrast between the vernier patterns formed on the wafer layers, (2) a shallow depth of focus of the microscope objective, and (3) operator eye strain.

The highest accuracy commonly achieved by manual reading of the offset between a pair of overlapping vernier patterns is on the order of $\pm\delta/2$. However, this level of accuracy may not be sufficient in the future as the size of, and the spacing between, the windows through the wafer layers shrinks.

Thus, there is a need for a technique for automatically determining the lateral offset between a pair of overlapping vernier patterns with a high degree of accuracy.

BRIEF SUMMARY OF THE INVENTION

Briefly, the present invention relates to a method for automatically determining the lateral offset between first and second overlapping vernier patterns. The method is initiated by first capturing the image of the overlapping vernier patterns. Next, the captured image is correlated with an image representative of a pair of aligned vernier patterns and the location of the maximum of the correlated images is then found. Thereafter, the offset error between the overlapping vernier patterns is determined in accordance with the distance between the center of the first vernier pattern and the location of the maximum of the correlated images.

DETAILED DESCRIPTION

Figure 1:
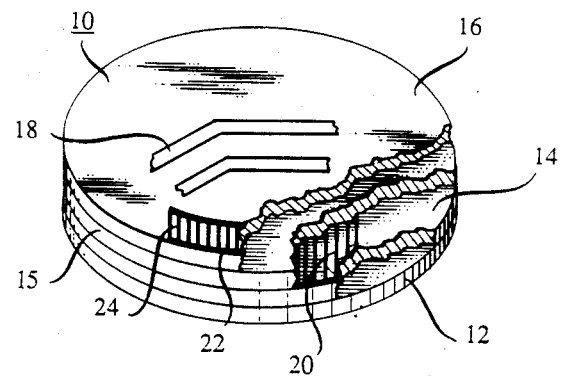
FIG. 1 is an exploded view of a semiconductor wafer having each of a pair of overlapping vernier patterns printed on overlying layers thereof.

FIG. 1 is a partially cut-away perspective view of a semiconductor wafer 10 according to the prior art. The wafer 10 is comprised of a base portion 12 having a plurality of overlying layers thereon, only two of which 14 and 15 have been shown for purposes of simplicity. Typically, the layers 14 and 15 are successively grown on the base portion 12, one above the other. Overlying the layer 15 is a layer of resist 16 which is patterned by selective exposure to radiation through a photomask (not shown) and then developed to create features or windows 18 therein. When the wafer 10 is etched, the windows 18 will be made to extend through the layer 15. The layer 14 also has windows (not shown) which are similarly created therein prior to formation of the layer 15 thereover.

In order to assure proper operation of the semiconductor devices formed from the wafer 10, it is important that the windows 18 in the layer 16 (which are made to extend through the layer 15) be precisely located relative to those windows created in the layer 14. Even very small overlay errors can render the wafer 10 unsuited for semiconductor device fabrication. In order to measure the overlay error, a first vernier pattern 20 is etched into the layer 14 at the same time the windows therein are etched. A second vernier pattern 22 is created during the patterning of the layer of resist 16 so as to at least partially overly the vernier pattern 20. The vernier patterns 20 and 22 are each comprised of a plurality of very thin bars 24, each typically 2-3 microns wide. The bars 24 of the vernier pattern 20 are typically spaced a distance D apart, whereas the bars of the vernier pattern 22 are spaced a distance $D+\delta$ apart where D and $\delta$ are typically 15 microns and 0.125 microns, respectively. It should, however, be understood that the spacing between the lines 24 of the vernier patterns 20 and 22 could be $D+\delta$ and D, respectively.

Figure 2:
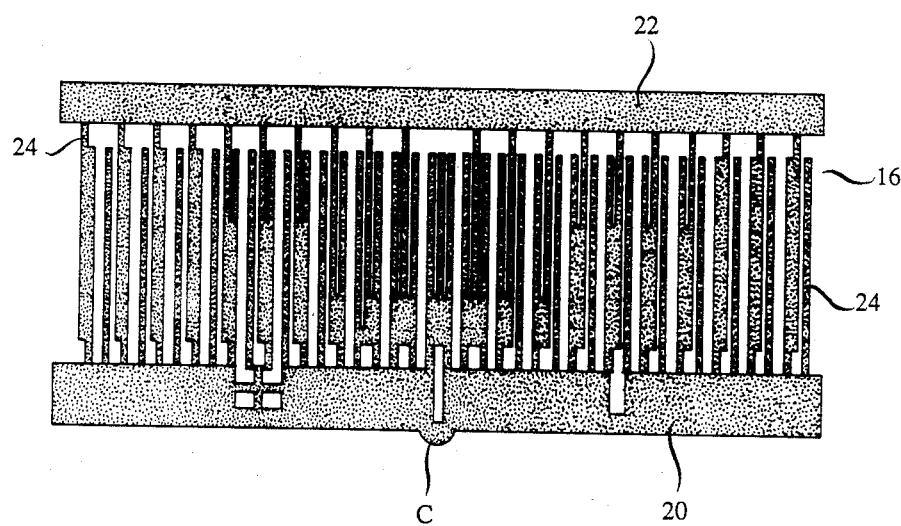
FIG. 2 is a plan view of a portion of the wafer of FIG. 1 showing the overlapping vernier patterns.

FIG. 2 is a plan view of the resist layer 16, showing the overlapping vernier patterns 20 and 22. In practice, the layer 14 (see FIG. 1) is light transmissive, and thus both of the vernier patterns 20 and 22 are visible when looking directly down at the resist layer 16. The pattern 22 is designed so the bars 24, for the most part, appear between the bars of the vernier pattern 20. In this way, when the vernier pattern 22 is shifted relative to the vernier pattern 20, the bars 24 of the former appear to move relative to the bars of the latter. The alignment of the vernier pattern 22 with the vernier pattern 20 is deemed to occur at the point at which one of the bars 24 of the former is best centered (spaced halfway) between a pair of lines of the latter. As may be seen in FIG. 2, the bar 24 which is located at the center C of the vernier pattern 22 appears to be best centered between a pair of the bars of the pattern 20. The offset between the vernier patterns 20 and 22 shown in FIG. 2 is zero because the product of $\delta$ and n, the number of whole spacings of width D between the best centered bar 24 of the vernier pattern 22 and the bar at the center C thereof, is zero.

The task of manually determining which of the bars 24 of the vernier pattern 22 is best centered between the bars of the vernier pattern 20 is not always straightforward. While the bar 24 at the center C of the vernier pattern 22 is actually the best centered one, the bars on either side thereof may also appear to the human eye to be best centered as well. Thus, even a skilled operator can easily misjudge the point at which the vernier patterns 20 and 22 are aligned.

Figure 3:
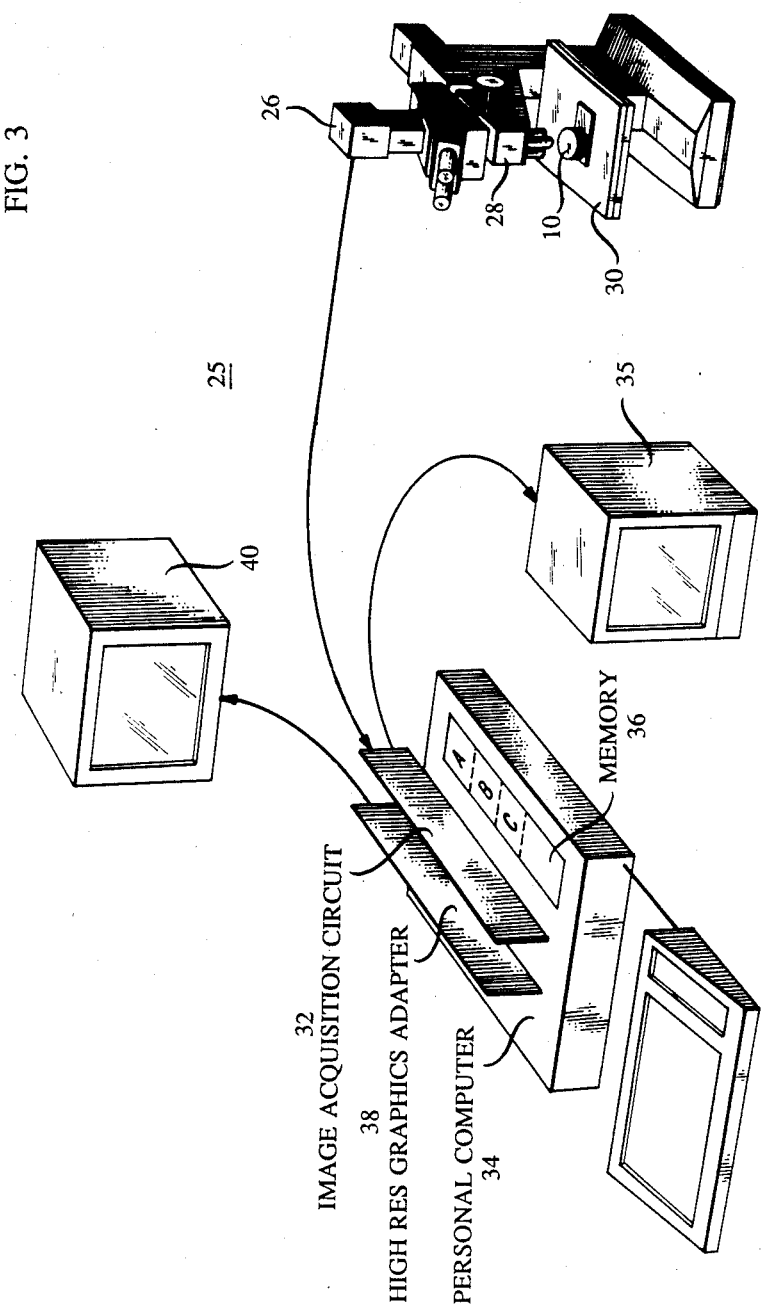
FIG. 3 is a block diagram of a system for automatically determining the lateral offset between the overlapping vernier patterns of FIGS. 1 and 2.

To overcome the aforementioned disadvantages associated with manual determination of the offset error between the vernier patterns 20 and 22, a system 25, schematically illustrated in FIG. 3, was developed to automatically determine the offset error between the vernier patterns. The system 25 comprises a charge-coupled device (CCD)- type television camera 26. In an exemplary embodiment, the television camera 26 comprises a model MVC-1 television camera, manufactured by World Video Corp., Boyertown, PA, which contains a 450 by 512 array of charge-coupled devices (not shown). Each charge-coupled device produces an analog output signal indicative of the intensity of a small picture element (pixel) of the image lying within the field of view of the television camera 26.

The television camera 26 is optically coupled to a microscope 28 having a stage 30 thereon adapted to support the wafer 10. The microscope 28 serves to magnify the image of the vernier patterns 20 and 22 on the wafer 10 observed by the television camera 26. The television camera 26 is electrically coupled to an image acquisition circuit 32 contained within a computer 34. In an exemplary embodiment, the image acquisition circuit 32 comprises a "PC Vision" image acquisition board manufactured by Imaging Technology, Woburn, Mass. The computer 34 comprises either an AT&T model 6300 or 6300+ personal computer, both sold by AT&T, Morristown, N.J.

The image acquisition circuit 32 operates under the control of the computer 34 to process the analog output signals from the charge-coupled devices within the television camera 26. In particular, the image acquisition circuit 32 generates digital information indicative of the intensity of each of the pixels within the image captured by the television camera 26. In the exemplary embodiment, the microscope 28 has a 100× objective, which causes the field of view of the television camera 26 to be much larger than that of the vernier patterns 20 and 22 (see FIGS. 1 and 2). Thus, the data produced by the image acquisition circuit 32 will be representative not just of the intensity of the image of the vernier patterns 20 and 22, but also of a portion of the area on the surface of the layer 16 (see FIG. 1) surrounding the vernier pattern. However, only the intensity of the image of the vernier patterns 20 and 22 is of interest for the purposes of determining the offset error therebetween.

Separation of the image of the vernier patterns 20 and 22 from that of the surrounding area on the surface of the layer 16 can be accomplished in several ways. For example, the computer 34 can be programmed to process the data acquired by the image acquisition circuit 32 to obtain the intensity of the pixels within each of several strips, each perpendicular to the bars 24 (see FIGS. 1 and 2) of the vernier patterns 20 and 22. Consequently, the wafer 10 must be carefully positioned on the stage 30 so that the vernier patterns 20 and 22 lie aligned within a predefined window (not shown) within the field of view of the television camera 26. It is also helpful if the wafer 10 is positioned on the stage 30 so the center C of the vernier pattern 22 is coincident with a reference point within this predefined window, usually the center thereof, whose location is known to the computer 34.

To aid an operator in placing the wafer 10 on the stage 30, a television monitor 35 is coupled to the image acquisition circuit 32 to display the image lying within the predefined window within the field of view of the television camera 26. By observing the monitor 35, the operator can know whether the wafer 10 has been properly positioned so the image of the vernier patterns 20 and 22 is within and is aligned relative to the predefined window and the center C of the vernier patterns is coincident with the center of the window. Once the wafer 10 has been properly positioned on the stage 30, then the operator instructs the computer 34 to store the output data from the image acquisition circuit 32 in a memory 36 in the computer. The data indicative of the intensity of the pixels in each of several strips extending horizontally across the image of the vernier patterns 20 and 22 is then read into a first buffer A in the memory 36.

Alternatively, the computer 34 can be programmed to process the output data from the image acquisition circuit 32 to automatically locate where the image of the vernier patterns 20 and 22 appears within the field of view of the television camera 26. Typically, the vernier patterns 20 and 22 have a much higher contrast than that of the surrounding area on the surface of the layer 16. Thus, from the output data produced by the image acquisition circuit 32, indicative of the intensity of the image captured by the television camera 26, the computer 34 can easily locate the image of the vernier patterns 20 and 22. Once the image of the vernier patterns 20 and 22 has been located within the field of view of the television camera 26, then the computer 34 automatically creates a window (not shown) aligned about the image of the vernier patterns. The center of the window, which is known to the computer 34, is made to correspond to the center C of the vernier pattern 22. Once the window is created, then the computer 34 automatically stores the intensity of each of the pixels within each of several strips extending horizontally across the window in the buffer A in the memory 36.

In addition to being coupled to the image acquisition circuit 32, the computer 34 is also coupled to a high-resolution graphics adapter circuit 38, typically comprised of an AT&T "Digital Enhancement Board" available from AT&T, Morristown, NJ. The high-resolution graphics adapter 38 allows the computer to produce very high resolution graphical displays on a television monitor 40 coupled to the high-resolution graphics adapter.

Figure 4:
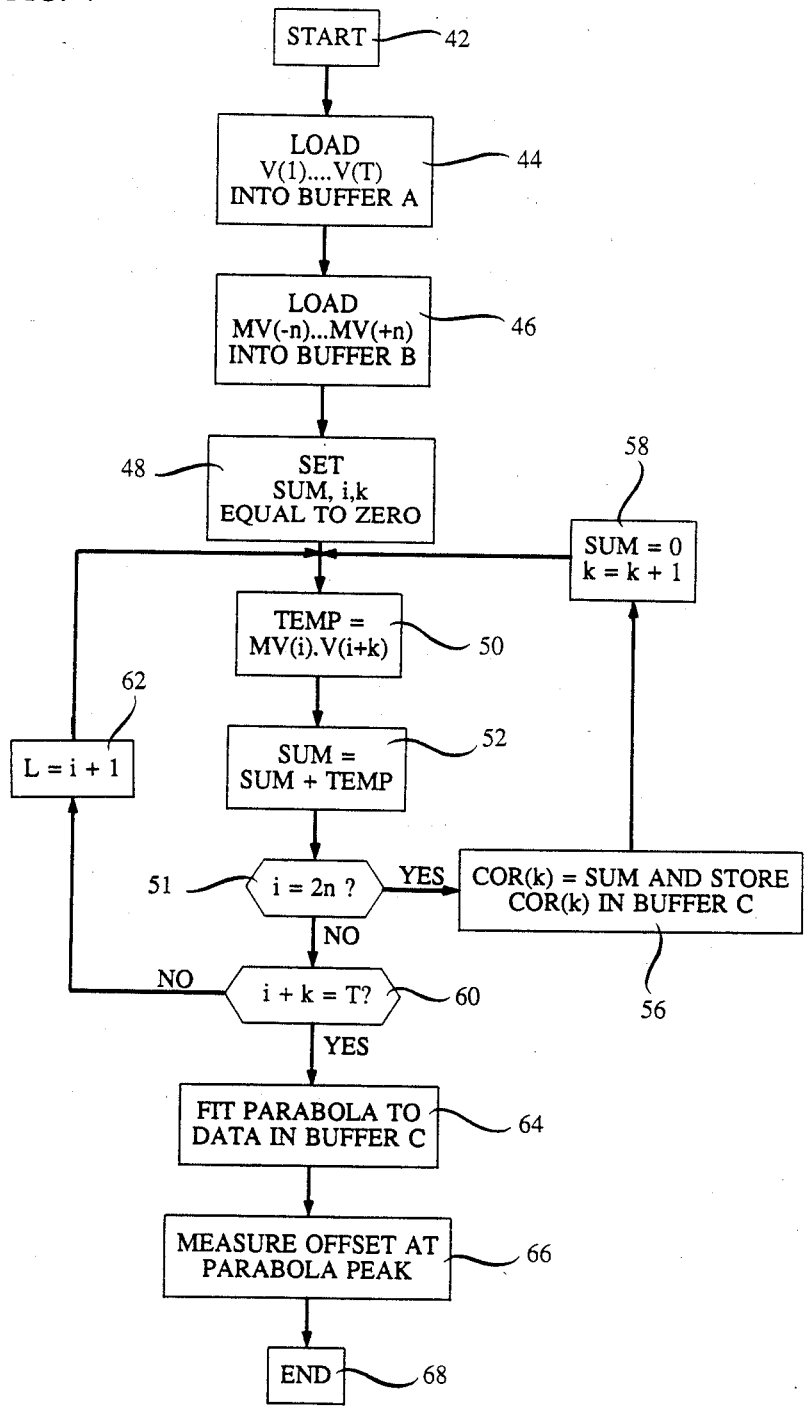
FIG. 4 is a flowchart representation of a program executed by the system of FIG. 3.

FIG. 4 is a flowchart representation of a program executed by the computer 34 of FIG. 3 to automatically determine the offset error between the vernier patterns 20 and 22 of FIGS. 1 and 2. Program execution commences when the computer 34 executes step 42. During step 42, the computer 34 acquires and stores the intensity of the image of the vernier patterns 20 and 22. Also during step 42, the computer 34 establishes each of a plurality of digital values $V(1) \ldots V(T)$. Each of the digital values $V(1) \ldots V(T)$ is representative of the intensity of a successive one of the pixels within a strip extending horizontally across the image of the vernier patterns 20 and 22.

As may be appreciated, the number T of intensity values $V(1) \ldots V(T)$ will depend on the actual length (as measured in pixels) of the image of the vernier patterns 20 and 22. The actual size of each pixel depends on the magnification factor of the microscope 28. With the objective of the microscope 28 being 100×, each pixel was measured to be 0.16×0.18 microns. The size of each pixel was determined by counting the number of pixels, in the x and y direction which lay along a known length. In an exemplary embodiment, the vernier patterns 20 and 22 of FIGS. 1 and 2 are on the order of 64 microns long, so T is on the order of 400.

In practice, the intensity values V(1) ... V(T) are not actually generated directly from the intensity value of the pixels in a single horizontal strip extending across the image of the vernier patterns 20 and 22. Rather, each of the intensity values V(1) ... V(T) is actually derived by taking the average of the intensity of each pixel in each strip with the pixel in the same position in each of several adjacent strips extending horizontally across the image of the vernier patterns 20 and 22. In this way, a more uniform measure of the intensity of the image of the vernier patters 20 and 22 is obtained.

Figure 5:
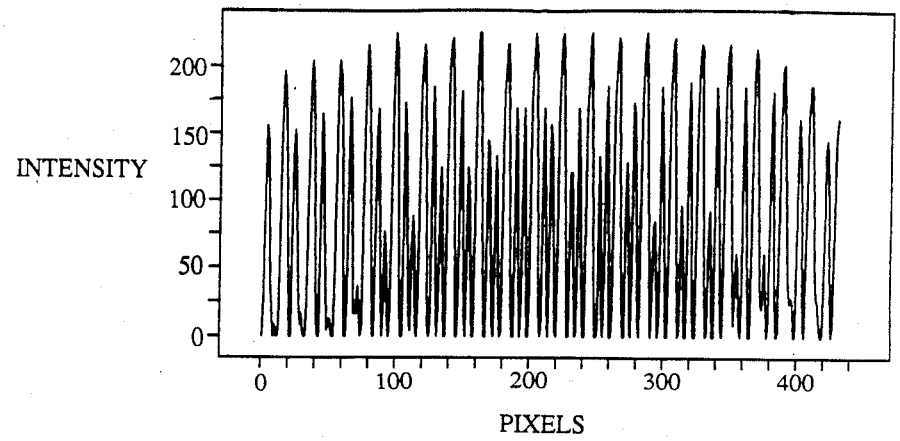
FIG. 5 is a graphical representation of the intensity of the image of the overlapping vernier patterns of FIGS. 1 and 2.

The pixel intensities represented by the digital values V(1) ... V(T), when plotted, appear as shown in FIG. 5. The ordinate of FIG. 5 is denominated in units of intensity. Each of the units along the abscissa of FIG. 5 corresponds to the number of the pixel whose intensity is represented by a separate one of the digital values V(1) ... V(T).

Following step 42, each of the digital values V(1) ... V(T) is then loaded in a successive one of a plurality of storage locations within the buffer A (see FIG. 3) in the memory 36 of FIG. 3 (step 44). Next, each of a plurality of digital values MV(−n) ... MV(0) ... MV(+n), where n is typically equal to 45, is first produced and then loaded into a separate one of the storage locations in a second buffer B (see FIG. 3) in the memory 36 (step 46). The digital values MV(−n) ... MV(0) ... MV(+n) are representative of the intensity of each of the pixels within that portion of the image of the pair of vernier patterns 20 and 22 about the point of alignment therebetween. The value MV(0) is representative of the intensity of the pixel located at the point of alignment of the vernier patterns 20 and 22. The values MV(−n) and MV(+n) each represent the intensity of the pixel within the strip located n pixels to the left and the right, respectively, of the pixel whose intensity is given by MV(0).

Figure 6:
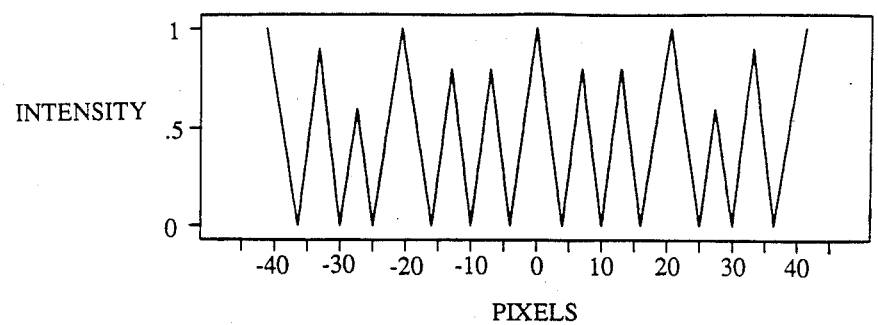
FIG. 6 is a graphical representation of the intensity of an image representative of a pair of aligned vernier patterns.

The values MV(−n) ... MV(0) ... MV(+n) may be derived by creating a symmetric pulse pattern whose periodicity is established by D and D+δ and then shaping each of the pulses so as to correspond to the pulses appearing in the pixel intensity plot shown in FIG. 5. FIG. 6 is a graphical representation of such a master pattern created in this manner. Like FIG. 5, the abscissa of FIG. 6 is denominated in pixels. However, pixel 0 along the abscissa in FIG. 6 corresponds to the pixel at the point of symmetry. The ordinate of FIG. 6, while denominated in units of intensity, is scaled much smaller than the ordinate of FIG. 5. Each of the values MV(n) ... MV(0) ... MV(−n) can be obtained by simply reading the intensity value along the ordinate of FIG. 6 for each pixel along the abscissa thereof.

To better understand why the master pattern of FIG. 6 can be said to represent the intensity of the pixels comprising an image representative of the vernier patterns 20 and 22 about the point of alignment therebetween, reference should be had to FIG. 2. As may be appreciated from visual observation of FIG. 2, the overlapping vernier patterns 20 and 22 are symmetric about the bar 24 which passes through the point C on the pattern 22. It is this bar 24 which appears best centered between a pair of the bars of the vernier pattern 20. Hence the point of symmetry of FIG. 2 corresponds to the point at which the vernier patterns 20 and 22 are aligned. Since the plot of FIG. 5 is representative of the intensity of each of the successive pixels within a strip extending horizontally across the image of the vernier patterns 20 and 22 shown in FIG. 2, the plot shown in FIG. 5 will also be symmetric about the point where the vernier patterns are aligned. As indicated, the intensity pattern of FIG. 6 is created by producing a pattern of pulses having the same periodicity as that of the vernier patterns 20 and 22. The periodicity of the vernier patterns 20 and 22 is directly related to the pixel intensity plot seen in FIG. 5, since the bars 24 of each vernier pattern tend to scatter the light incident therein whereas the spaces in between the bars are highly reflective. Thus, the point of symmetry of FIG. 6 corresponds to the point of symmetry of FIG. 5. If the pixel intensity plot of FIG. 5 is said to be symmetric about the point of alignment between the vernier patterns 20 and 22, then the point of symmetry of FIG. 6 will be coincident with the point of vernier pattern alignment. Therefore, it follows that the pattern of FIG. 6 will be representative of the intensity of the pixels comprising the image of a pair of aligned vernier patterns.

Referring to FIG. 4, following step 46, the computer 34 of FIG. 3 next sets three variables "i," "k" and "sum" initially equal to zero (step 48). Thereafter, a variable "temp" is set equal to the product of MV(i) and V(i+k) (step 50) where MV(i) and V(i+k) represent the $i^{th}$ and $(i+k)^{th}$ intensity values stored in buffers B and A, respectively. Thus, when i and k are initially zero, the product of MV(−n) and V(0) is computed during step 50. After step 50, the value of the variable sum is set equal to the combined value of the variables temp+sum (step 52). A check is then made whether the current value of the variable i equals the value of 2n, the total number of values stored in buffer B of memory 35 of FIG. 3 (step 54). When i=2n, then the current value of MV(i) equals MV(+n), the last value stored in buffer B and program execution branches to step 56. During step 56 the $k^{th}$ component of a vector COR, having T components cor(1) ... cor(T), is assigned the current value of the variable sum. After step 56, the variables sum and i are reset to zero while the value of the variable k is incremented by unity (step 58) before program execution branches back to step 50.

When the value of i is found to be less than the value of 2n during step 54, then program execution branches to step 60. During step 60, a check is made as to whether i+k=T. In other words, the computer 34 of FIG. 3 checks whether the current value of V(i+k) equals V(T), the last stored value in the buffer A of memory 35. If i+k<T, then program execution branches to step 62 whereupon the value of the variable i is incremented by unity. Following step 62, step 50 and those following it are re-executed.

Each time step 56 is executed, the value of cor(k) will will be given by $$cor(k) = \sum_{i=-n}^{i=+n} V(i+k) \times MV(i) \quad (1)$$

Equation (1) is a discrete approximation of the integral equation $$\text{cor}(k) = \int_{T_{-n/2}}^{T_{n/2}} V(t+k) \times MV(t) \, dt \qquad (2)$$

where t is a continuous variable and $T_{n/2}$ is one half the length (in pixels) of the master pattern of FIG. 6. The integral equation (2) corresponds to the well-known correlation integral equation:

$$c(\tau) = \lim_{T_o \to \infty} \frac{1}{2T_o} \int_{-T_o}^{+T_o} f(t)g(t+\tau) dt \qquad (3)$$

which stipulates that the dependence of two functions f(t) and g(t) is given by $c(\tau)$ where $\tau$ is a continuous time displacement in the range of $(-\infty, +\infty)$ and is independent of t. As may now be appreciated, each component cor(k) of the vector COR represents the correlation of MV(i) and V(i+k) where i runs from $-n$ to $+n$ and k runs from 0 to T.

The correlation of any function with itself is known as autocorrelation. Correlation of the function MV(i) with itself is defined as a(k). The function a(k) will have its maximum at k=0 since the greater the correspondence between two functions, the greater the value of their correlation.

The reason for considering the autocorrelation of MV(i) is that MV(i) is a symmetric function and is similar to V(i+k) about the region where the latter has its point of visual symmetry. Thus, when MV(i) is correlated with V(i+k), the maximum value of cor(1) ... cor(T) will occur at the point where MV(i) and V(i+k) have the same symmetry. The point where MV(i) and V(i+k) have the same symmetry is the point at which the vernier patterns 20 and 22 of FIGS. 1 and 2 are aligned with each other.

Figure 7:
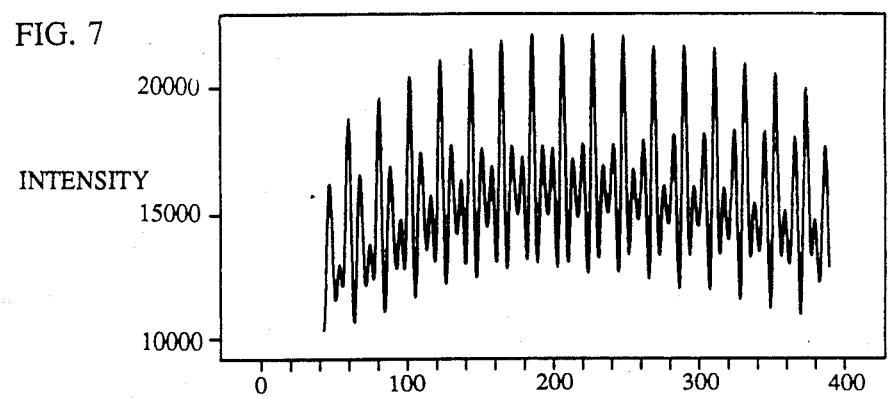
FIG. 7 is a graphical representation of the intensity of the overlapping vernier patterns after correlation with the intensity of the image representing the aligned vernier patterns.

Since each of the components cor(1) ... cor(T) is computed from the product of MV(i) and V(i+k), which themselves are representative of pixel intensity, it follows that each of the values cor(1) ... cor(T) may be expressed in terms of pixel intensity. The pixel intensities represented by cor(1) ... cor(T), when plotted, appear as shown in FIG. 7. The maximum of the intensity plot of FIG. 7 occurs at the same pixel as the point of visual symmetry of FIG. 5, which corresponds to the location where the vernier patterns 20 and 22 are aligned.

The offset between the vernier patterns 20 and 22 can be found by first determining the number of pixels $P_o$ between the location at which the maximum of cor(1) . . . cor(T) occurs and the location of the center C of the vernier pattern 22. The pixel at which the maximum of the correlation of cor(1) ... cor(T) occurs can be determined visually from FIG. 7. The pixel at which the center C of the vernier pattern 22 is located is also known. This is because the center C of the vernier pattern 22 is coincident with a reference point within the window about the image of the vernier patterns 20 and 22 whose location is known to the computer 34. Once the number of pixels $P_o$ is known, the offset error (in microns) may be computed from the product of $P_o\delta/D$. The problem with determining the offset error in this manner is that it depends on visually determining the maximum of cor(1) ... cor(T) plotted in FIG. 7. Oftentimes, it may not be possible to visually determine the maximum of cor(1) ... cor(T) from FIG. 7 with a high degree of accuracy.

Figure 8:
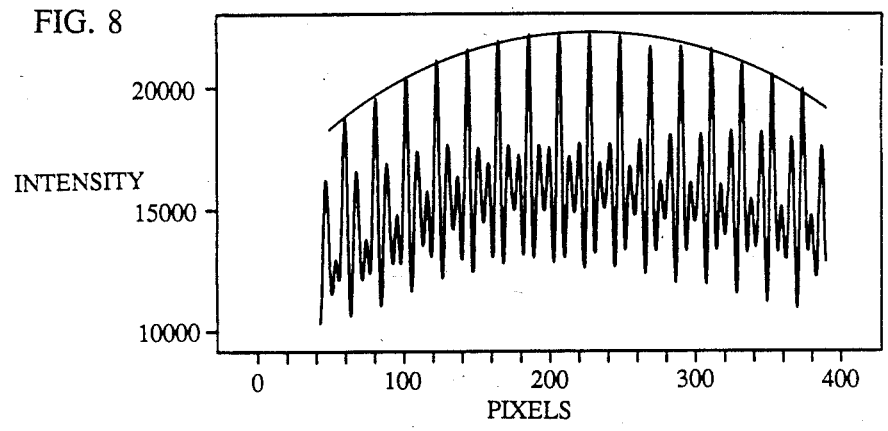
FIG. 8 is a graphical representation of the intensity plot of FIG. 7 showing a parabola fitted thereto.
Figure 9:
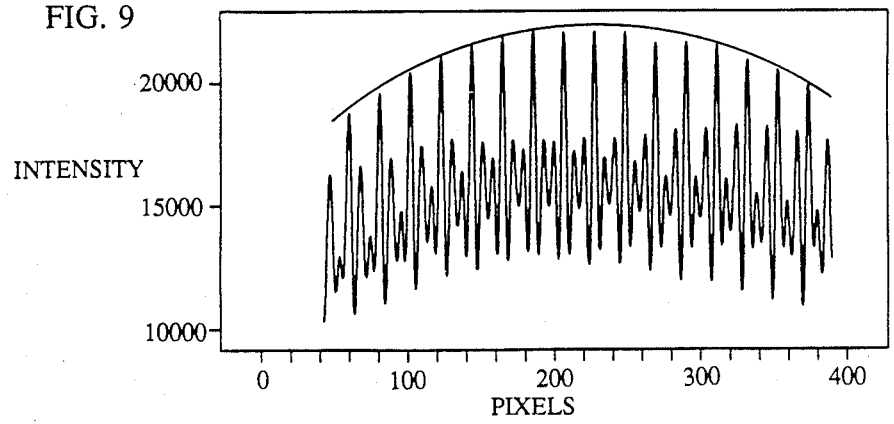
FIG. 9 is a graphical representation of the intensity plot of FIG. 8 showing the location of the maximum therein.

Rather than visually determining the maximum of cor(1) . . . cor(T), a mathematical technique may be employed. Referring to FIG. 4, if, during step 60, the combined value of the variable $i+k=T$, signifying that cor(1) ... cor(T) have all been calculated and stored in separate locations in buffer C, then program execution branches to step 64. During step 64, a parabola having the form $$Y = A + BX + CX^2 \qquad (4)$$

is mathematically fitted to the data stored in buffer C using well-known least squares techniques. FIG. 8 shows a parabola fitted to the plot of FIG. 7 which, as will be recalled, graphically depicts the pixel intensities represented by cor(1) ... cor(T). Following step 64, the lateral offset of the vernier patterns 20 and 22 is determined from equation (4), with the value of $P_o$ being given by the expression B/2C which gives the peak of the parabola defined by equation (4). FIG. 9 illustrates the parabola of FIG. 8 with a line drawn normal thereto so as to pass through the peak thereof. Following step 66, program execution ends (step 68). Rather than compute the value of $P_o$ using the technique of least squares, regression analysis could also be employed. The value of $P_o$, when mathematically computed in the manner discussed above, won't necessarily be an integer multiple of D as will be the case if $P_o$ were determined visually from FIG. 7. Thus, by mathematically computing the value of $P_o$, either by least squares or regression analysis, it is possible to read the offset between the vernier patterns 20 and 22 with an error less than the value of $\delta$.

In practice, it may be necessary to manipulate the master pattern depicted in FIG. 6 so the correlation of the values MV(−n) ... MV(0) ... MV(+n) obtained therefrom with the values V(1) ... V(T) yields a sharp maxima. For example, it may be necessary to scale the abscissa of FIG. 6 by a factor between 0.98 and 1.02 so that a sharper peak may be seen in FIG. 7. Once the intensity values MV(−n) ... MV(0) ... MV(+n) associated with the pair of vernier patterns 20 and 22 have been derived, the same master intensity values can be used for different wafers 10, provided that the vernier patterns thereon have the same values for T and $\delta$.

The system 25 has been described as being operative to automatically determine the lateral offset between the vernier patterns 20 and 22 on the wafer layers 14 and 16 to enable the offset between the windows 18 in the layers to be determined. The system 25 is equally useful for automatically determining the offset between a pair of overlapping vernier patterns on other objects so as to determine the offset error between each of a pair of features thereon, each precisely located relative to a separate one of the vernier patterns.

It is to be understood that the embodiments described herein are merely illustrative of the principles of the invention. Various modifications and changes may be made thereto by persons skilled in the art which will embody the principles of the invention and fall within the spirit and scope thereof.

What is claimed is:

1. A method of fabricating an article comprising the steps of:

forming at least a first vernier pattern on at least a first portion of a body at a known location thereon;

forming at least a second vernier pattern on at least a second portion of said body at a known location thereon so that the second vernier pattern at least partially overlaps said first vernier pattern;

determining the degree of offset between said first and second vernier patterns; and completing the fabrication of said article when the degree of offset between said first and second vernier patterns is less than a predetermined value, said determining step comprises the steps of:

capturing the image of said first and second vernier patterns;

correlating the intensity of the image of said first and second vernier patterns with the intensity of an image representative of a pair of aligned vernier patterns;

finding where the maximum of the correlated intensities is situated; and establishing the lateral offset between said first and second vernier patterns in accordance with the distance between said maximum and the center of said first vernier pattern.

2. The method according to claim 1, said correlating step comprises the steps of:

establishing a first set of intensity values, each representing the intensity of a separate one of a first plurality of picture elements (pixels) within the captured image of said first and second vernier patterns;

establishing a second set of intensity values, each representing the intensity of a separate one of a second plurality of pixels within said image representing the pair of aligned vernier patterns; and computing a plurality of correlation values, each associated with a separate one of said first plurality of pixels, each said correlation value being computed in accordance with the sum of the products of each of said first set of intensity values and each of said second set of intensity values.

3. The method according to claim 2, the maximum of said correlated intensity values is found by the steps of:

mathematically fitting a parabola to said correlation values; and locating the peak of said parabola.

4. A method of fabricating a semiconductor device comprising the steps of:

forming at least a first vernier pattern on a first layer of a semiconductor wafer so said vernier pattern is at a known location from a first feature thereon;

forming at least a second vernier pattern on a second overlying layer on said wafer so said second vernier pattern is at a known location from a second feature on said second layer, said second vernier pattern being formed so as to at least partially overlap said first vernier pattern;

determining the degree of offset between said first and second vernier patterns; and completing the fabrication of said semiconductor device when the degree of offset between said first and second vernier patterns is less than a predetermined value, said determining step comprises the steps of:

capturing the image of said first and second vernier patterns;

correlating the intensity of the image of said first and second vernier patterns with the intensity of an image representative of a pair of aligned vernier patterns;

finding where the maximum of the correlated intensities is situated; and establishing the lateral offset between said first and second vernier patterns in accordance with the distance between said maximum and the center of said first vernier pattern.

5. The method according to claim 4, said correlating step comprises the steps of:

establishing a first set of intensity values, each representing the intensity of a separate one of a first plurality of picture elements (pixels) within a strip extending horizontally across the captured image of said first and second vernier patterns;

establishing a second set of intensity values, each representing the intensity of a separate one of a second plurality of pixels within said image representing the pair of aligned vernier patterns; and computing a plurality of correlation values, each associated with a separate one of said first plurality of pixels, each said correlation value being computed in accordance with the sum of the products of each of said first set of intensity values and each of said second set of intensity values.

6. The method according to claim 5, the maximum of said correlated intensity values is found by the steps of:

mathematically fitting a parabola to said correlation values; and locating the peak of said parabola.

7. An article fabricated by a method comprising the steps of:

forming at least a first vernier pattern on at least a first portion of a body at a known location thereon;

forming at least a second vernier pattern on at least a second portion of said body at a known location thereon so that said second vernier pattern at least partially overlaps said first vernier pattern;

determining the degree of offset between said first and second vernier patterns; and completing the fabrication of said article when the degree of offset between said first and second vernier patterns is less than a predetermined value, said determining step comprises the steps of:

capturing the image of said first and second vernier patterns;

correlating the intensity of the image of said first and second vernier patterns with the intensity of an image representative of a pair of aligned vernier patterns;

finding where the maximum of the correlated intensities is situated; and establishing the lateral offset between said first and second vernier patterns in accordance with the distance between said maxima and the center of said first vernier pattern.

8. The article according to claim 7, said correlating step comprises the steps of:

establishing a first set of intensity values, each representing the intensity of a separate one of a first plurality of picture elements (pixels) within a strip extending horizontally across the captured image of said first and second vernier patterns;

establishing a second set of intensity values, each representing the intensity of a separate one of a second plurality of pixels within said image representing the pair of aligned vernier patterns; and computing a plurality of correlation values, each associated with a separate one of said first plurality of pixels, each correlation value being computed in accordance with the sum of the products of each first set of intensity values and each of said second set of intensity values.

9. The article according to claim 8 the maximum of said correlated intensity values is found by the steps of:
    mathematically fitting a parabola to said correlation values; and
    locating the peak of said parabola.

10. Apparatus for automatically determining the degree of misalignment between a pair of overlapping vernier patterns, said apparatus comprises:
    means for correlating the image of the pair of overlapping vernier patterns;
    means for correlating the intensity of the captured image with the intensity of an image representative of a pair of perfectly aligned vernier patterns;
    means for finding the location of the maximum of the correlated intensities; and
    means for determining the lateral offset error between the vernier patterns in accordance with the distance between the location of the maxima of the correlated intensities and the center of one of the pair of vernier patterns.

11. The apparatus according to claim 10, said means for capturing the image of the vernier patterns comprises a television camera means which produces an analog output signal in accordance with the intensity of the image captured thereby.

12. The apparatus according to claim 10 wherein said means for correlating the intensities, said means for finding the location of the maxima of the correlated intensities, and said means for determining the offset error comprise a computer.

13. Apparatus for automatically determining the lateral offset between a pair of vernier overlapping vernier patterns, each printed on adjacent, light-transmissive layers of a substrate, said apparatus comprises:
    a television camera means for capturing the image of the vernier patterns and for producing a signal varying in accordance with the intensity thereof;
    an image acquisition circuit means coupled to the television camera for processing the output signal thereof to determine the intensity of each of a first plurality of picture elements (pixels) lying within a strip extending across the image of the vernier patterns; and
    a computer programmed to correlate the intensity of each of the first plurality of pixels with each of a plurality of values, each corresponding to the intensity of a separate one of a second plurality of pixels within an image representative of a pair of aligned vernier patterns, said computer also being programmed to find the location of the maximum of the correlated intensities and to determine the lateral offset between the vernier patterns in accordance with the distance between the location of the maximum and the center of one of the pair of vernier patterns.

* * * * *

UNITED STATES PATENT AND TRADEMARK OFFICE
CERTIFICATE OF CORRECTION

PATENT NO. : 4,742,233  
DATED : May 3, 1988  
INVENTOR(S) : Birol Kuyel

Page 1 of 2

It is certified that error appears in the above—identified patent and that said Letters Patent is hereby corrected as shown below:

Column 11, line 9                       "value, said" should read --value, characterized in that said--.

Column 11, line 23                    "claim 1, said" should read --claim 1, characterized in that said--.

Column 11, line 40                    "claim 2, the" should read --claim 2, characterized in that the--.

Column 11, line 61                    "value, said" should read --value, characterized in that said--.

Column 12, line 7                      "claim 4, said" should read --claim 4, characterized in that said--.

Column 12, line 24                    "claim 5, the" should read --claim 5, characterized in that the--.

Column 12, line 41                    "value, said" should read --value, characterized in that said--.

Column 12, line 55                    "claim 7, said" should read --claim 7, characterized in that said--.

Column 13, line 1                      "each first" should read --each of said first--.

Column 13, line 4                      "claim 8, the" should read --claim 8, characterized in that the--.

UNITED STATES PATENT AND TRADEMARK OFFICE
CERTIFICATE OF CORRECTION

PATENT NO. : 4,742,233
DATED : May 3, 1988
INVENTOR(S) : Birol Kuyel

It is certified that error appears in the above—identified patent and that said Letters Patent is hereby corrected as shown below:

Column 13, line 11 characterized in that said--.     "patterns, said" should read --patterns Column 13, line 24 characterized in that said--.     "claim 10, said" should read --claim 10, Column 14, line 7 characterized in that said--.     "substrate, said" should read --substrate, Signed and Sealed this Fourth Day of October, 1988

Attest:

DONALD J. QUIGG

*Attesting Officer*     *Commissioner of Patents and Trademarks*